United States Patent
Hars et al.

(10) Patent No.: US 9,330,753 B2
(45) Date of Patent: May 3, 2016

(54) MEMORY SANITATION USING BIT-INVERTED DATA

(75) Inventors: Laszlo Hars, Lafayette, CO (US); Donald Preston Matthews, Longmont, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 991 days.

(21) Appl. No.: 12/955,579

(22) Filed: Nov. 29, 2010

(65) Prior Publication Data

US 2012/0137047 A1 May 31, 2012

(51) Int. Cl.
| | |
|---|---|
| *G06F 12/00* | (2006.01) |
| *G11C 11/56* | (2006.01) |
| *G11C 7/10* | (2006.01) |
| *G11C 13/00* | (2006.01) |
| *G11C 16/10* | (2006.01) |
| *G11C 16/34* | (2006.01) |

(52) U.S. Cl.
CPC .......... *G11C 11/5642* (2013.01); *G11C 7/1006* (2013.01); *G11C 11/5628* (2013.01); *G11C 11/5635* (2013.01); *G11C 13/0002* (2013.01); *G11C 13/0033* (2013.01); *G11C 16/10* (2013.01); *G11C 16/3418* (2013.01); *G11C 2211/5647* (2013.01)

(58) Field of Classification Search
USPC ......................................... 711/103
See application file for complete search history.

(56) References Cited

U.S. PATENT DOCUMENTS

| | | | |
|---|---|---|---|
| 6,229,731 B1 | 5/2001 | Kasai et al. | |
| 7,089,350 B2 | 8/2006 | Koren et al. | |
| 7,313,025 B1 * | 12/2007 | Wong et al. | 365/185.22 |
| 7,475,203 B1 | 1/2009 | Petrillo, Jr. et al. | |
| 7,581,118 B2 | 8/2009 | McGovern | |
| 8,111,538 B2 * | 2/2012 | Hosotani et al. | 365/148 |
| 8,359,447 B1 * | 1/2013 | Trimberger | 711/170 |
| 2006/0117393 A1 | 6/2006 | Merry et al. | |
| 2006/0152173 A1 | 7/2006 | Erez | |
| 2008/0104384 A1 | 5/2008 | Rios et al. | |
| 2009/0052241 A1 * | 2/2009 | Baek et al. | 365/185.03 |
| 2009/0216945 A1 * | 8/2009 | Shimada | 711/113 |
| 2010/0161914 A1 * | 6/2010 | Eilert et al. | 711/154 |

* cited by examiner

*Primary Examiner* — Jared Rutz
*Assistant Examiner* — Hamdy S Ahmed
(74) *Attorney, Agent, or Firm* — Hall Estill Attorneys at Law

(57) ABSTRACT

Method and apparatus for sanitizing a memory using bit-inverted data. In accordance with various embodiments, a memory location is sanitized by sequential steps of reading a bit value stored in a selected memory cell of the memory, inverting the bit value, and writing the inverted bit value back to the selected memory cell. The memory cell may be erased between the reading and writing steps, as well as after the writing step. Random bit values may be generated and stored to the memory cell, and run-length limited constraints can be used to force bit-inversions.

19 Claims, 5 Drawing Sheets

NAND FLASH

MEMORY SANITATION USING BIT-INVERTED DATA

SUMMARY

Various embodiments of the present invention are generally directed to sanitizing a memory using bit-inverted data.

In accordance with various embodiments, an exemplary method generally comprises sequential steps of reading a bit value stored in a selected memory cell of the memory, inverting the bit value, and writing the inverted bit value back to the selected memory cell.

In related embodiments, an exemplary apparatus generally comprises a memory having a plurality of memory cells, and a controller adapted to execute a memory sanitizing operation by sequentially directing a read operation upon at least one selected memory cell of the memory to retrieve a bit value stored therein, a bit-inversion operation upon the retrieved bit value to generate an inverted bit value, and a write operation to write the inverted bit value back to the at least one selected memory cell.

These and other features and advantages which characterize the various embodiments of the present invention can be understood in view of the following detailed discussion and the accompanying drawings.

DETAILED DESCRIPTION

Figure 1:
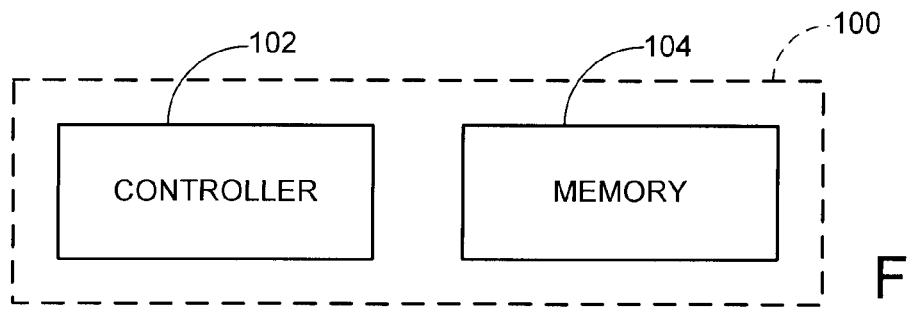
FIG. 1 provides a functional block representation of a data storage device.

The present disclosure generally relates to data security and more particularly to sanitizing a memory through the use of a novel secure erasure operation. Data security is an important issue as memory devices, such as hard disc drives (HDDs), solid-state drives (SSDs), flash memory "thumb" drives, etc., continue to be used in a wide number of consumer, commercial, governmental and military applications.

It is often desirable that a memory be subjected to a special memory sanitizing operation to ensure that previously stored data in the memory cannot be easily recovered by an unauthorized third party. A number of U.S. Federal and State Regulations require memory devices to be securely erased under certain circumstances, and failure to do so may result in civil and/or criminal penalty. Some well-known governmental standards that set forth various requirements for secure erasure include the NIST 800-88 Enhanced Secure Erase Standard and the DoD 5220 Block Erasure Standard.

These and other standards provide a variety of ways in which non-destructive erasure of a memory can be carried out. In some cases, existing data are overwritten and erased a number of consecutive times in order to mask the magnetic, electrical and/or optical signatures of previous storage states. Even when a memory cell has been subjected to multiple writes/erasures, however, a sophisticated and motivated attacker may still be able to use a variety of laboratory techniques to recover the previously stored data.

Many existing secure erasure techniques can be time and power consuming, and in some cases can significantly reduce the remaining operational life of the memory. Some types of flash memory cells that store data in a multi-level cell (MLC) configuration may be initially limited to a total number of around 5,000 erasure cycles. Thus, conventional secure erase operations that involve numerous repeated erasures may tend to significantly reduce the lifetime of the device, and may not fully secure the device from informational leakage.

Accordingly, various embodiments of the present invention are generally directed to a method and apparatus for carrying out a secure erasure of memory. As discussed below, an intelligence-based approach is used in which data bits previously written to the memory are bit-inverted and rewritten to ensure a full distribution of different memory storage values. In some embodiments, random (including pseudo-random) values can be written using run-length limited constraints so that forced bit-inversions are periodically inserted into the write sequence. In other embodiments, non-standard recording states can be written to further mask the signature of previously written data.

The various approaches disclosed herein can be readily used in any number of different types of memory devices, such as solid-state non-volatile memory arrays including but not limited to flash memory, spin-torque transfer random access memory (STRAM), resistive random access memory (RRAM), and programmable logic cells (PLCs). The various approaches can also be adapted to other types of storage media such as but not limited to magnetic recording discs.

FIG. 1 shows a functional block representation of an exemplary data storage device 100 in which various embodiments of the present invention can be advantageously practiced. The device 100 includes a controller 102 and a memory module 104. The controller 102 provides top level control for the device 100 and may be configured as a programmable processor with associated programming in local memory.

The memory module 104 can be arranged as one or more non-volatile memory elements such as rotatable recording discs or solid-state memory arrays. A separate controller is unnecessary, as alternative embodiments may incorporate the controller functions directly into the memory module. While not limiting, for purposes of the present discussion it will be contemplated that the data storage device 100 is characterized as a solid-state drive (SSD) that utilizes flash memory cells in the memory module 104 to provide a main data store for a host device.

Figure 2:
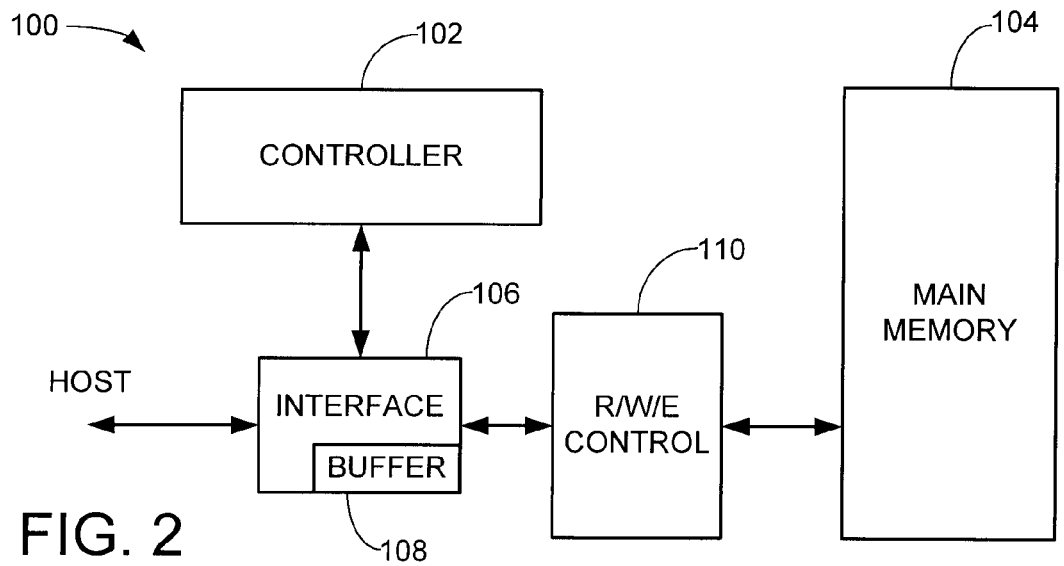
FIG. 2 shows an internal configuration of the device of FIG. 1 in accordance with some embodiments.

FIG. 2 shows the device 100 in accordance with some embodiments. The controller 102 accesses an interface circuit 106 with local volatile buffer memory 108 to communicate with a host device (not shown) and to temporarily store data being transferred between the host and the memory 104. A read/write/erase (R/W/E) control circuit 110 facilitates read, write and erase operations upon the memory 104. The data may be stored in fixed sized sectors.

In some embodiments, the host identifies the sectors via a logical block address (LBA) scheme so that host issues read and write requests in terms of LBAs (e.g., "retrieve LBAs 100-199"). The controller 102 converts each LBA in a host access command to an associated physical block address (PBA) indicative of the physical location for the data within the memory 104. The host generally does not know, or care to know, the physical location of each LBA within the array. Indeed, the controller may change the PBA of the associated LBA each time a new data write command for the LBA is issued, as well as at other suitable times.

Figure 3:
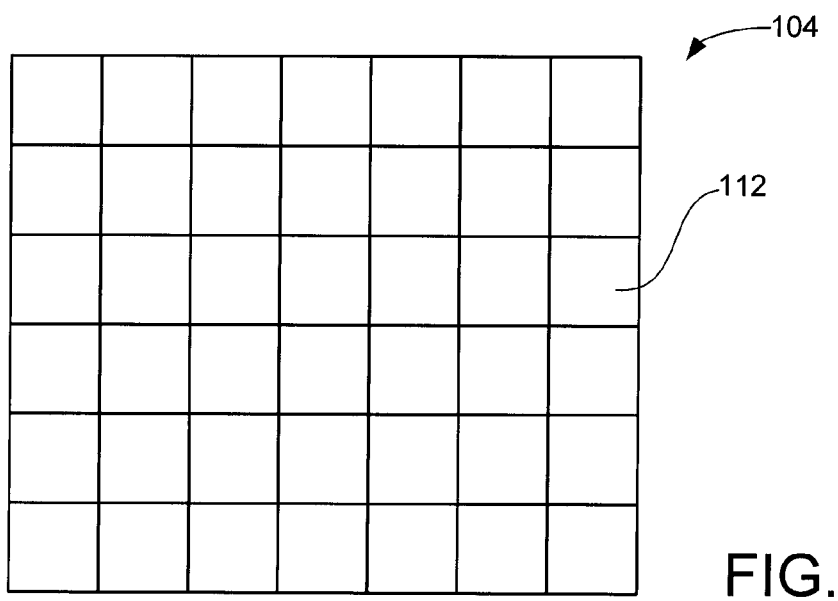
FIG. 3 shows a functional block representation of a portion of the memory array of the device of FIG. 1 arranged into a number of addressable blocks of memory.

FIG. 3 provides a functional representation of portions of the non-volatile memory 104 of FIGS. 1-2. Non-volatile memory cells are arranged into addressable erasure blocks 112. Each block 112 is a separately erasable memory space and may be arranged as M×N memory cells. Each row of cells may be referred to as a page of memory, and each page is configured to store a selected amount of user data.

Block-level wear leveling may be employed by the controller 102 to track the erase and write status of the various blocks 112, and new blocks will be allocated for use as required to accommodate newly received data. In at least some embodiments, a full page worth of data is written to each page at a time. Multiple LBAs may be written to the same page, and a given LBA's worth of data may be physically stored so as to span multiple pages. Filler bits may be appended to a selected set of input data if a full page worth of data is not supplied for writing in a given write operation. Error correction codes such as parity bits may be incorporated at the page level to correct errors as a full page worth of data is retrieved. Metadata and other control information may be stored in each erasure block 112, or stored elsewhere such as in specific blocks 112 dedicated to this purpose.

If data for a particular LBA are presently stored in a first page and the device 100 receives a write command to write new, updated data for that LBA, the controller 102 may select a second, new page to store the updated data and mark the LBA data in the first page as old data. When all of the data in a page are superceded, the page is marked for erasure. When enough pages in a given block are marked for erasure, a garbage collection operation may be scheduled in the background to copy current version data to a new block and to erase the existing block.

Figure 4:
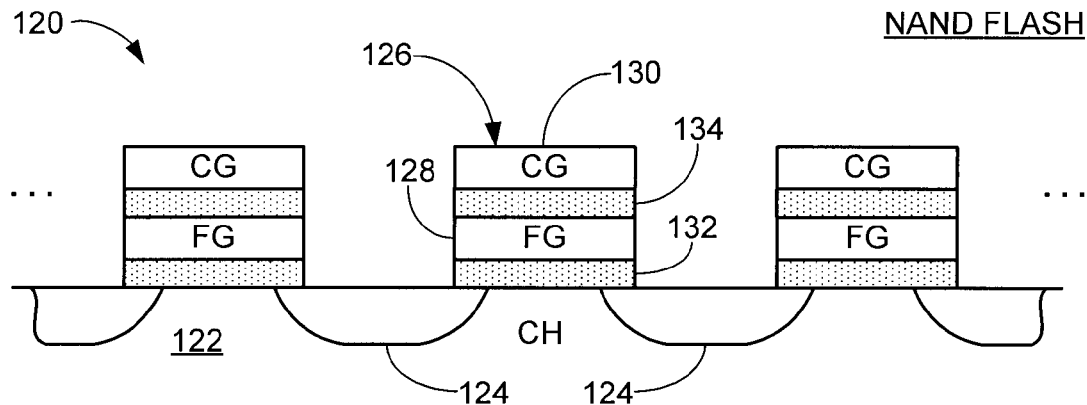
FIG. 4 illustrates a construction of individual memory cells in the array as Flash memory cells.

FIG. 4 shows individual flash memory cells 120 of the memory 104 in accordance with some embodiments. The memory cells are arranged on a semiconductor substrate 122 in a NAND configuration, although such is not limiting. Localized n+ doped regions 124 are formed in the substrate 122, and gate structures 126 span each pair of adjacent doped regions so that each flash cell takes a general nMOS transistor configuration.

Each gate structure provides an alternating stack of electrically conductive gates 128, 130 and electrically insulative regions 132, 134. Data are stored by each cell 120 in relation to the relative amount of electrical charge stored on the gate 128, which is characterized as a floating gate (FG).

The FG 128 accumulates charge during a programming operation by the selected application of appropriate voltages to the adjacent doped (drain and source) regions 124 and the gate 130, characterized as a control gate (CG). These applied voltages induce the controlled migration of electrical charge from a channel (CH) portion of the semiconductor substrate 122 to the FG 128 across isolation region 132.

In an initial erased state, there will be substantially no accumulated charge on the FG 128. In this state, the cell will exhibit drain-source conductivity across the channel CH without the application of voltage to the CG 130. Once charge has been accumulated on the FG 128, the drain-source path will be non-conductive unless a sufficiently high gate control voltage is applied to the CG 130, at which point the cell becomes conductive. The programmed state of the cell 120 can thus be determined by observing the level of CG voltage required to allow drain-source current to pass through the cell, which generally correlates to the amount of accumulated charge on the FG 128.

The cells 120 can be configured as single-level cells (SLCs) or multi-level cell (MLCs). An SLC flash cell 120 stores a single bit; a normal convention is to assign the logical bit value of 1 to an erased cell (substantially no accumulated charge) and a logical bit value of 0 to a programmed cell (presence of accumulated charge). An MLC flash memory cell 120 stores multiple bits, such as two bits. Generally, n bits can be stored using $2^n$ storage states. A normal convention is to assign the multi-bit logical value 11 to an erased cell with charge C0 (substantially no accumulated charge), and then sequentially assign multi-bit logical values 10, 01 and 00 to increasingly higher charge levels C1, C2 and C3 where C0<C1<C2<C3.

An erasure operation is required to remove accumulated charge from the FG 128. This generally requires application of a relatively high voltage to the CG 130 to cause migration of the charge from the FG 128 back to the channel across region 132. All of the memory cells in a selected erasure block 112 (FIG. 3) are erased concurrently during an erasure.

Figure 5:
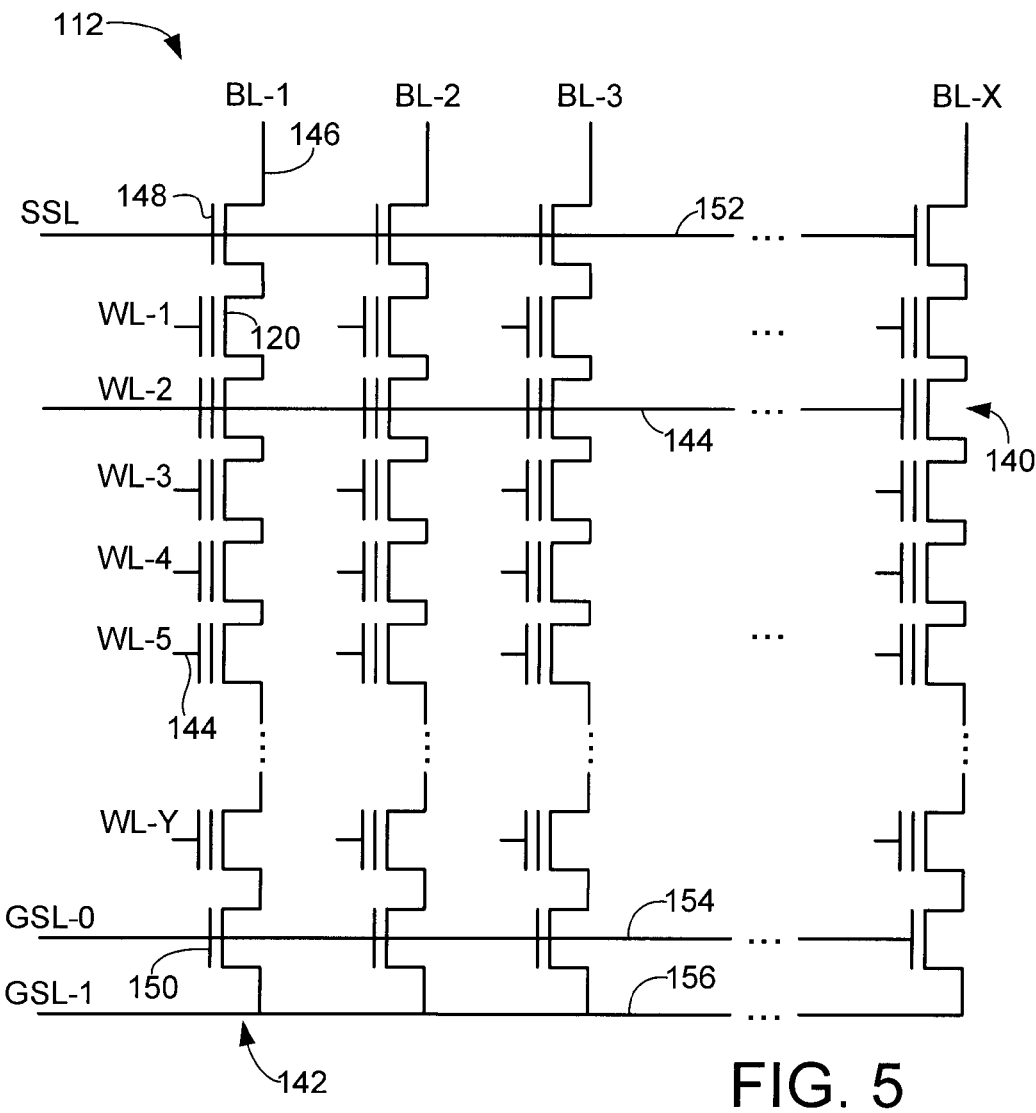
FIG. 5 shows a schematic representation of the array using Flash memory cells from FIG. 4.

FIG. 5 is a schematic depiction of a selected erasure block 112 formed from the memory cells 120 of FIG. 4 in accordance with some embodiments. The memory cells 120 are arranged into rows 140 and columns 142. The cells 120 along each row 140 are coupled to a common word line 144 (denoted WL-1 to WL-Y). Each word line 144 interconnects the CGs 130 of the memory cells 120 along that row.

The cells 120 along each column 142 are coupled to a common bit line 146 (denoted BL-1 to BL-X). Select transistors 148, 150 are placed at opposing ends of each column 142, and global select lines SSL, GSL-0 and GSL-1 are provided at 152, 154 and 156.

Data are stored along each row (page) 140. To read the programmed states of a selected page, the SSL and GSL-0 lines are placed at an appropriate activation voltage such as Vdd, and GSL-1 is placed at a reference voltage such as Vss. The word line for the selected row (e.g., WL-2) is set to Vss, and the remaining word lines are set at a higher voltage (e.g., Vdd+) sufficient to place all of the associated cells in a conductive state irrespective of programmed state.

The bit lines BL-1 through BL-X are thereafter successively strobed with an appropriate voltage such as Vdd, and the programmed states of the flash cells 120 along the selected row (WL-2) are determined in relation to whether current flows through the respective columns. It will be appreciated that this read technique is merely exemplary, as other reading sequences can be used as desired. To read MLC programmed cells, a sequence of different control voltages may be successively applied to the selected word line to differentiate among the various programmed states.

While operable as a reliable and efficient means for storing data, flash memory cells such as 120 tend to exhibit incomplete migration of charge across the barrier region 132 during write and erase operations. Once charge is accumulated onto the FG 128, some remnant of that charge may remain after an erasure operation. Cells that have never received charge may exhibit lower baseline levels of charge on the FG as compared to cells that have been programmed. Even if multiple programming and erasure operations have been applied, a variety of laboratory techniques can be used to recover the originally programmed states of a block of cells.

A secure erasure operation can be applied in an effort to sanitize the memory, that is, wipe the memory clean of residual evidence that points to a previously programmed state. Memory sanitizing is intended to prevent prior stored data from leaking during the application of investigatory techniques.

Conventional secure erasure operations often utilize repetitive write/erase cycles in which selected data, such as random/pseudo-random data, are written to a block of cells, followed by an erasure, followed by another application of data, followed by another erasure, and so on. Empirical analysis has found that even after a statistically significant number of such write/erase cycles, a significant number of the cells may still leak information at a sufficient signature level to enable discovery. It is not necessary that the previous stored states of every cell be determined; even if the states of only a small portion of the cells along a selected page can be recovered, this may be sufficient for sophisticated code analysis algorithms to accurately reconstruct the originally stored data along the entire page.

Accordingly, various embodiments of the present invention generally operate to sanitize a memory in such a way as to ensure a statistically significant number of different states are written during a secure erasure. A variety of approaches are set forth, each generally involving the use of bit-inverted data overwrites to the cells. It is contemplated that the secure erasure will be carried out by the device 100 responsive to a host level request, so that the secure erasure is initiated responsive to an externally generated signal. The device 100 may alternatively or additionally use internal algorithms to initiate the secure erasure operation at appropriate times.

Figure 6:
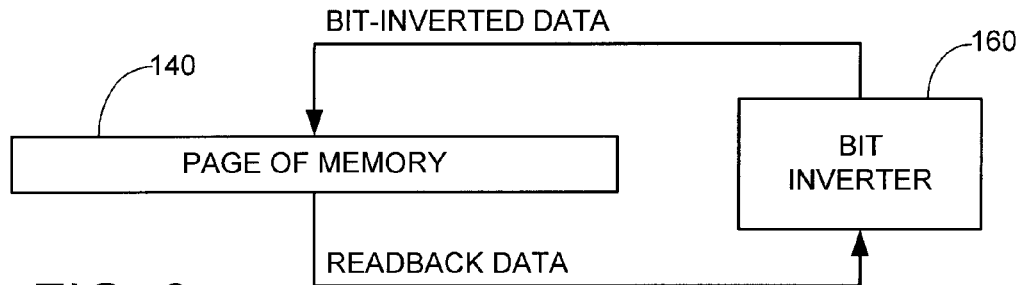
FIG. 6 illustrates a secure erasure of a portion of the memory array in accordance with some embodiments.

FIG. 6 illustrates one exemplary secure erasure operation that may be carried out by the device 100 upon a selected erasure block 112 in accordance with various embodiments. It will be appreciated that these steps may be carried out on each page 140 of memory within the selected erasure block in turn. The secure erasure of FIG. 6 begins by reading out the contents of the selected page 140, and supplying these readback data to a bit inverter block 160.

The readback data may comprise a full page worth of data, such as about 4 KB. The data may be serially provided to the bit inverter one bit at a time, or the entire multi-bit sequence may be supplied concurrently and stored in a buffer or other local memory. It will be appreciated that the multi-bit sequence may not be uniform (e.g., all logical 0s), but rather may include at least one logical 0 and one logical 1.

The bit inverter 160 inverts each bit in the readback sequence, so that each logical 0 in the readback sequence becomes a logical 1, and each logical 1 in the readback sequence becomes a logical 0. This produces a bit-inverted data set which, after an erasure, is written back to the page 140. The above cycle is repeated a selected number of times, resulting in each cell having roughly the same number of 0s and 1s written thereto.

It is contemplated that as few as around 3-5 write/erase cycles carried out in this manner may be sufficient to prevent leakage of previously recorded data states. In some embodiments, the process of FIG. 6 can begin by erasing the page 140 and then writing random (which includes pseudo-random) data thereto, after which the above-described bit-inversion cycling is applied. As before, it is contemplated that the random data will include both logical 0s and logical 1s in various bit locations in the multi-bit sequence.

If MLC programming is applied to the cells, the bit-inversion process can be applied in any suitable fashion sufficient to account for all of the respective possible data states. In some embodiments, the bits are simply inverted on an individual basis as before; for example, a readback value of 00 would become 11, a readback value of 10 would become 01, and so on. In an alternative embodiment, a more complex algorithm is applied such as a cyclical bit-inversion process, which may be carried out using a conversion table 166 that sequentially associates each of the available states with a different one of the remaining states.

For example, the bit-inversion table 166 may be configured such that a readback value of 00 may become 10, a readback value of 10 may become 11, a readback value of 11 may become 01, and a readback value of 01 may become 00. It can be seen that from this cyclical approach that every cell will be written to every available programmed state in as few as three write/erase cycles, no matter what the beginning state was for each cell.

As desired, statistics can be maintained by the device 100 with regard to how many write/erasures have taken place on a block, page and/or memory cell level. Such statistics can be consulted and used to bring the total number of writes/erasures for a particular portion of the memory up to a desired level. This may further help to reduce the ability of an attacker to identify portions of the memory that have received greater or lesser amounts of utilization than other portions of the memory. Thus, in this scheme a first page (or other portion of memory) may receive a number A write/erase cycles, and a second page (or other portion of memory) may receive a number B write erase cycles, where B>A, during the same sanitization process.

Figure 7:
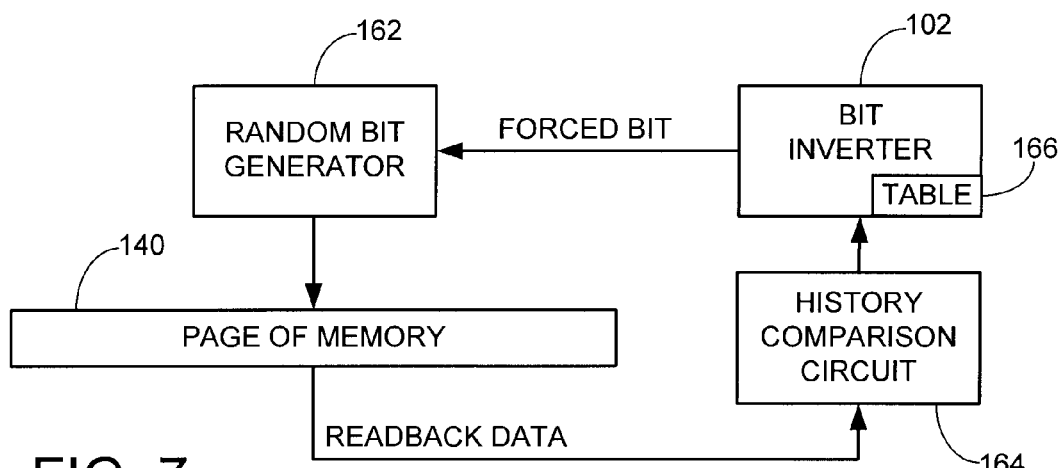
FIG. 7 illustrates a secure erasure of a portion of the memory array in accordance with related embodiments.

FIG. 7 illustrates an alternative related secure erasure operation that uses a random bit generator 162, a history comparison circuit 164 and a bit inverter such as 160 from FIG. 6. The random bit generator 162 is used to generate a new set of random (including pseudo-random) data, which are successively written to the page 140 during each pass. These data sequences are read out from the page and supplied to the history comparison circuit 164, which may include sufficient memory to enable the storage of data sequences (patterns) over multiple cycles.

Generally, the system of FIG. 7 is operated over a predetermined number of write/erase cycles as before. During each cycle, random data are generated and written to the page of memory, the written data are read back from the page, and the page is erased. The history comparison circuit 164 monitors the randomness of the data on an individual cell basis, and uses run-length limited constraints to force a bit-inversion of a particular bit if sufficient randomness is not observed.

For example, if a particular cell in the page 140 is written with three logical 0s in a row (e.g., 0, 0, 0), then the history comparison circuit 164 may set a flag, causing the bit inverter 160 to force a logical 1 to be written to that cell during the next cycle. The same rules can be applied to logical 1s; for example, once three logical 1s have been written in a row, a logical 0 bit-inversion may be forced into the next sequence at that location.

Different run-length rules may be applied to different logical states; for example, no more than two logical 0s in a row may be permitted, whereas no more than three logical 1s in a row may be permitted, and so on. Different run-length rules may be applied to different pages in the same erasure. For reference, it will be noted that a multi-bit random data sequence having one or more forced bit inversions can be viewed as an inverted-bit representation of the previous multi-bit random data sequence at least with regard to those bit locations at which the forced bit inversions occurred.

As with FIG. 6, FIG. 7 can be readily adapted to securely erase SLC or MLC cells. In an MLC context, the decision to force bit-inversions may occur at the individual bit level or on a multi-bit level. For example, if a sequence of both 11s and 10s immediately occur in the sequence for a particular cell, a forced bit-inversion may require the writing of a 00 or a 01 to that cell, and so on.

It is contemplated that each of these various alternative approaches can be carried out on a page-by-page basis. That is, an entire erasure block 112 can be selected for the secure erasure operation, and the above techniques can be applied to each page in the selected erasure block in turn. In alternative embodiments, only selected pages in a given erasure block may be subjected to the overwriting of data, while the entirety of the erasure block will be erased each time. In further embodiments, data from one page from the selected erasure block may be used to influence the writing of data to another page in that block; for example, data from a first page may be read out, bit inverted, and written to all of (or a portion of) the remaining pages in the block. Similarly, random data may be read out from one page and applied to multiple other pages.

Figure 8:
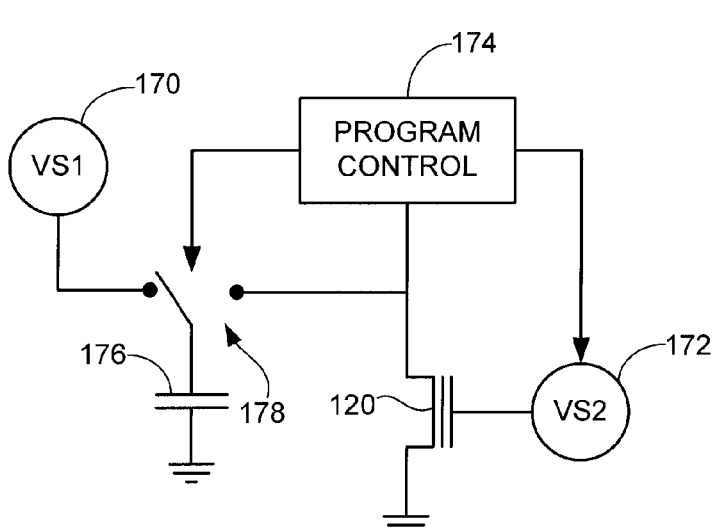
FIG. 8 illustrates a secure erasure of a portion of the memory array in accordance with further related embodiments.

FIG. 8 is a simplified schematic block representation of a programming sequence on a selected memory cell 120. FIG. 8 includes a bit line write voltage source (VS1) 170, a word line voltage source (VS2) 172, a program control block 174, a charge pump capacitor 176, and a switch 178 which may be a transistor or other switching device. During a write operation in accordance with the foregoing discussion, the bit line voltage source 170 charges the capacitor 176 up to a selected write voltage, such as 20V. At the appropriate time, the switch 178 is activated by the program control block 174 to direct the accumulated charge from the capacitor 176 through the cell 120, thereby causing the accumulation of a portion of this charge onto the FG 128.

In systems that employ this type of charge pump arrangement, the amount of accumulated charge on the FGs 128 may tend to be supplied in discrete units of nominally equal value. During the writing of MLC states, a selected programmed state is identified, a quantum of accumulated charge is applied to the floating gate, and the program control block 174 performs a read operation to determine whether sufficient charge has been accumulated on the FG 128 to achieve the desired programmed state. If not, another quantum of charge is applied and the process is repeated until the program control block 174 determines that sufficient charge has been accumulated for the desired state.

Figure 9:
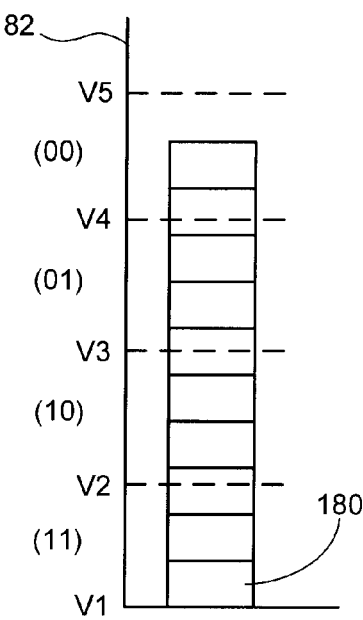
FIG. 9 graphically represents different quantums of accumulated charge on a floating gate of a flash memory cell.

FIG. 9 graphically illustrates this process. In FIG. 9, each block 180 represents an accumulated quantum of charge that can be placed onto the FG 128 during each charge cycle of FIG. 8. While the blocks 180 are shown to be uniform in magnitude, some variation may be experienced both on an individual cell level as well as on an individual charging cycle level. The particular number of blocks 180 required to achieve each state may vary so FIG. 9 is merely illustrative and not limiting.

The blocks 180 are arranged into a stack that is aligned with a y-axis line 182 that generally indicates magnitude of total accumulated charge on the FG 128 under different conditions. Various control voltages V1 through V5 are superimposed onto this y-axis 182 and represent different CG voltages that may be supplied by the word line voltage source 172 (VS2 in FIG. 8) during a read operation. Generally, these voltages are applied to differentiate between the different storage states (11), (10), (01) and (00) as shown in FIG. 9.

By way of illustration, the voltage V3 in FIG. 9 has a magnitude such that cells programmed to the logical states (11) or (10) will be rendered conductive across their drain-source channel when V3 is applied to the CG 130, whereas cells programmed to the states (01) or (00) will not be rendered conductive. Similarly, the voltage V4 will be sufficient to place cells stored in logical states (11), (10) and (01) in a conductive state, whereas application of V4 will not be sufficient to induce conductivity of a cell stored as logical state (00). The voltage V5 is sufficient to render all cells conductive irrespective of the programmed logical states of the cells.

The MLC programmed state of the cell can be determined by applying these different voltages in a controlled fashion. For example, voltage V3 may be applied first to determine whether the cell is rendered in a conductive state, and then either V2 or V4 may be subsequently applied to identify the specific state of the cell.

Previous states of the memory cell may be identifiable in relation to the remnant effects of having stored different quantums of accumulated charge. The above bit-inverted approaches can be applied in an effort to mask these effects to a low enough detection level (e.g. −130 dB, etc.) such that the previous state cannot be reliably determined.

In further embodiments, the secure erasure approaches disclosed herein can be enhanced to place non-standard amounts of charge onto the floating gate to further mask previously stored states. For example, in order for the circuit of FIG. 8 to write the state 01 to the memory cell 120, the process may normally use six charge pump cycles, since from FIG. 9 it can be seen that the sixth unit of charge 180 is sufficient to supply enough accumulated charge to enable voltage V3 to render the cell in a conductive state. In some embodiments the circuit can further operate to continue with the charging process to add a seventh unit of charge to the FG 128. In such case the memory cell will still be programmed to the logical state 01, but with a different, non-standard total amount of charge. This may help to further mask previously stored states if analysis techniques are designed to expect statistically segregated amounts of residual charge on the gates.

The floating gate may be supplied with a non-standard total amount of charge in any number of ways. In one exemplary approach, a random number is generated and a total number of charge increments 180 are applied to a particular cell during the write/erasure processing that corresponds to the generated random number. In another approach, normal processing is applied to program a particular state, and then a selected number (including a randomly generated number) of additional charge increments are applied.

Figure 10:
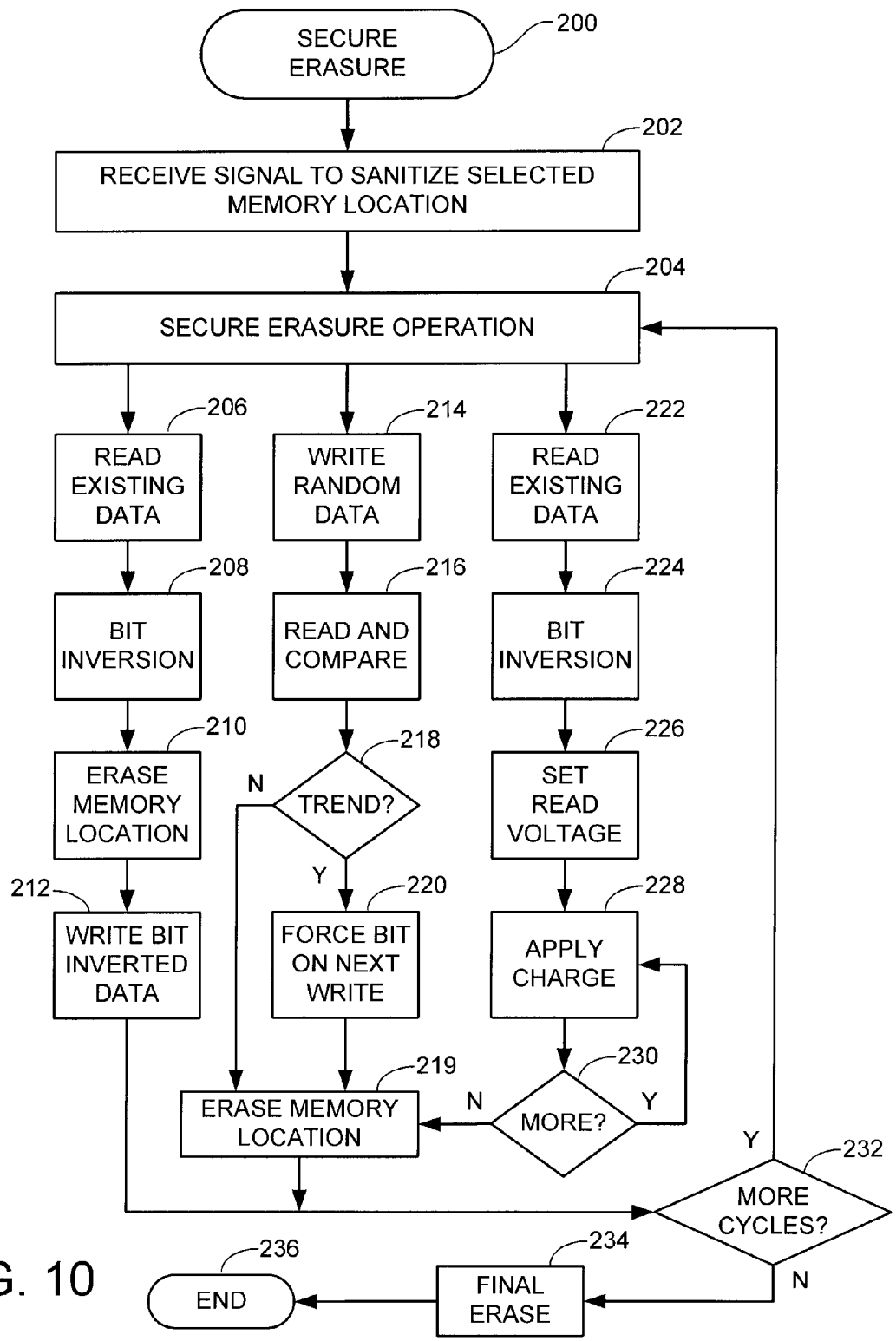
FIG. 10 is a flow chart for a SECURE ERASURE routine carried out in accordance with various embodiments of the present invention to sanitize a memory.

FIG. 10 sets forth a SECURE ERASURE routine 200, generally illustrative of steps carried out in accordance with various embodiments. The routine 200 may be carried out by the device 100 of FIGS. 1-2 using the controller 102 and associated programming stored in memory (e.g., the buffer 108) to sanitize all or a portion of the main memory 104. The various steps in the routine 200 are merely exemplary and may be omitted, repeated, performed in a different order, or otherwise modified as required.

At step 202, an internal or external signal is received which directs the device to proceed with a secure erasure operation.

This signal may include an identification of a particular physical memory location that should be securely erased. In some embodiments, the signal may be provided in terms of LBAs or other host level addressing, and the controller 102 may operate in response to identify the associated physical locations that should be securely erased in order to wipe the requested data from the memory. Some amount of preparatory garbage collection may be necessary prior to continuing with the secure erasure.

When the device is ready to proceed, as shown by step 204, a variety of approaches may be taken to securely erase the selected memory location. It will be understood that a particular secure erasure operation through the routine 200 may involve multiple ones of these alternative approaches, and may even incorporate each of them in turn. Some initial processing of the selected memory location may take place at this time, such as an initial erasure or an initial erasure followed by the writing of random data thereto. Alternatively, the secure erasure may begin with the currently stored data in the memory location.

In one approach, the existing data from the selected memory location are read, as shown by step 206. A bit inversion operation is applied to the readback data, step 208, and memory location is erased at step 210. The bit-inverted data are then written back to the memory location, step 212. This generally corresponds to the various sequences discussed above in FIG. 6.

In another approach, random or pseudo-random data are written to the memory location, step 214. This may follow an initial erasure operation upon the memory location during step 204. The random or pseudo-random data written during step 214 are read and compared to determine whether an unacceptable trend has developed that exceeds allowable runlength limited rules, as denoted by steps 216 and 218.

If no unacceptable trend is detected, an erasure takes place at step 219. If a trend is detected, the flow passes to step 220 where a bit-inversion is forced for that particular cell during the next pass through the routine. An erasure then takes place as before at step 219. This operation generally corresponds to the various sequences discussed above in FIG. 7.

The operation of step 220 may include the inversion of the bit value for the selected cell and the setting of a flag so that, during the next pass through step 214, a new random data multi-bit sequence is generated, and the inverted bit value previously identified at step 220 is inserted at the appropriate location in this sequence.

In still another approach, the existing stored data in the memory location is read, step 222, and a bit inversion of some or all of the data may be applied, step 224. A read gate voltage is selected at step 226, programming charge is applied to the FG 128 at step 228, and a decision is made at step 230 to determine whether additional charge should be applied to the FG 128. If so, another charge pump cycle is applied, and this process is continued until the desired quantums of charge have been accumulated. This operation generally corresponds to the above discussion of FIGS. 8 and 9, and may include the application of a non-standard amount of charge to the FG 128. As before, the written data state is next erased at step 219.

Regardless of the secure erasure path employed, the routine passes to decision step 232 to determine whether an additional write/erase cycle should be applied. In some embodiments, an initial number of total write/erase cycles is selected, such as but not limited to about 3-8 write/erase cycles. A different path may be selected each time through the routine.

If one or more additional cycles are required, the routine returns to step 204 until the total number of desired cycles has been completed. Once the total number of cycles has been completed, the memory location may be subjected to one final erasure at step 234 (if the memory is not already in an erased state), and the secure erasure operation ends at step 236. As an alternative to leaving the securely erased memory location in a final erased state, it may be desirable to write selected data, including but not limited to random data, to the memory at the conclusion of the process. This may further help to mask the fact that a secure erasure operation has taken place on this location.

The total number of write/erase cycles may be adaptive and may be adjusted in a controlled fashion based on measured parameters or other requirements, such as differing levels of security. Overall it is generally contemplated that the secure erasure techniques of FIG. 10 will significantly reduce the number of write/erase cycles required to achieve a selected erasure security level. It has been found that the processing of FIG. 10 may tend to provide as good or better memory wiping through as few as five intelligently selected write/erase cycles as compared to conventional write/erase cycling that requires 35 or more random write/erase cycles.

The techniques of FIG. 10 are readily adaptable to other forms of memory, such as but not limited to magnetic discs, STRAM, RRAM, PLC and other types of non-volatile memories. The techniques can be applied to memories that do not require a separate erasure, such as memory cells that can be transitioned from any selected programmed state to any other available programmed state using normal write processing instead of a specially configured erasure operation. Thus, the terms "erasure," "secure erasure" and the like as used herein will be understood in accordance with the foregoing discussion to describe the wiping of a memory to mask a previously written state without necessarily involving a separate erasure process that is distinct from a programming operation.

Figure 11:
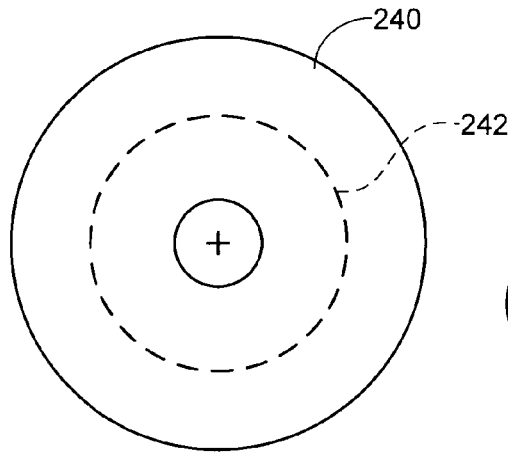
FIG. 11 illustrates a rotatable magnetic recording disc that may be sanitized in accordance with the routine of FIG. 10.

FIG. 11 generally illustrates a rotatable recordable magnetic disc 240 on which a number of concentric tracks are defined to store user data in fixed sized blocks (sectors). One such track is represented at 242. The various approaches disclosed can be readily adapted to erase a single track of data (or a portion thereof), or a band of such tracks arranged as a block.

Figure 12:
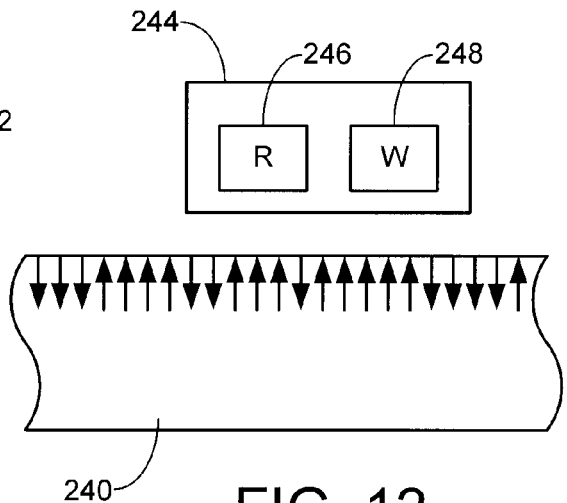
FIG. 12 represents a data read/write transducer adjacent the recording disc of FIG. 11.

As will be appreciated, such discs can be accessed by moveable read/write transducer 244, FIG. 12, which may have separate read (R) and write (W) elements 246, 248 that are brought into close proximity to the rotating disc 240 during operation. The transducer 242 may be hydrodynamically supported adjacent the disc responsive to such rotation. The transducer 244 stores data to the disc 240 as a sequence of magnetic domains, which may extend along the media in a direction parallel to or perpendicular to the tracks.

A secure erasure operation as generally set forth by FIG. 10 can be applied to the magnetic disc 240. In some embodiments, to securely erase a selected track (e.g., the track 242) the read element 246 can be positioned adjacent the track 242 to recover the data stored thereto. A bit-inversion operation can be applied to the readback data and the write element 248 can be positioned adjacent the track during a subsequent revolution of the disc 240 to write bit-inverted data. Similarly, random or pseudo-random patterns can be generated and written by the write element 248 as discussed above.

As desired, radial offsets can be applied to the transducer 244 to ensure that the edges of the track 242, as well as the medial portions thereof, are sufficient overwritten a desired number of passes. A separate erasure operation can be applied but is not necessarily required, and can be carried out by performing a DC erase in which the same magnetic domain orientation is applied to the entire track by the write element between successive write cycles. Various levels of write current can be selected for passage through the write element 248 to vary the field strength of the written domains during different passes to further mask previously written data signatures.

Figure 13:
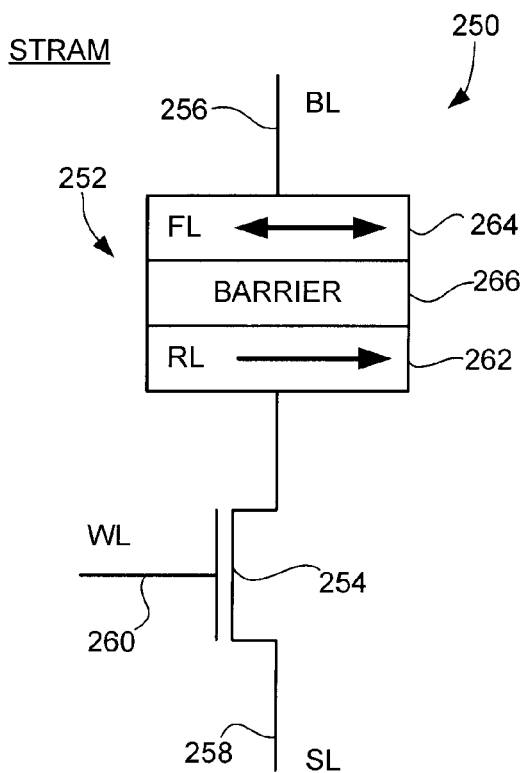
FIG. 13 illustrates a spin-torque transfer random access memory (STRAM) cell that can be sanitized in accordance with the routine of FIG. 10.

FIG. 13 depicts a memory cell 250 arranged as a 1T1R STRAM memory cell. The STRAM memory cell includes a resistive memory element 252 characterized as a magnetic tunneling junction (MTJ), and a switching device 254 characterized as an nMOS transistor. The memory cell 250 is accessed by a number of control lines such as bit line (BL) 256, source line (SL) 258 and word line (WL) 260. Other connection configurations are contemplated such as a crosspoint array.

The MTJ 252 includes a pinned reference layer (RL) 262 having a fixed magnetic orientation and a free layer (FL) 264 having a variable magnetic orientation. The free layer 264 is separated from the reference layer 262 by an intervening tunnel barrier layer 266. Spin-torque write currents can be passed through the memory cell to set the magnetic orientation of the free layer 264 relative to the reference layer 262 to store data. A parallel orientation in which the free layer 264 is in the same magnetic orientation as the reference layer 262 provides a relatively lower electrical resistance RL, and an anti-parallel orientation in which the free layer 264 is opposite that of the reference layer 262 provides a relatively higher electrical resistance RH. The different resistances, and hence, the programmed state of the cell 250, can be determined by passing a relatively low magnitude read current through the cell and sensing the voltage drop thereacross.

It is contemplated that the previously stored magnetic domains of the free layer 264 may be discoverable using laboratory techniques, and so the various secure erasure approaches discussed herein and set forth by FIG. 10 can be readily applied to STRAM memory cells such as 250. For example, the existing magnetic orientation of the free layer 264 may be read, the readback data bit may be inverted, and this new inverted bit may be written to change the orientation of the free layer. Additionally or alternatively, random data may be successively written and forced bit inversions may occur to obtain the statistically desired distributions of different states. Different varying amount of write current or other parameters may be adjusted to further alter the magnetic domain signature of the free layer (and potentially other aspects of the memory cell).

Figure 14:
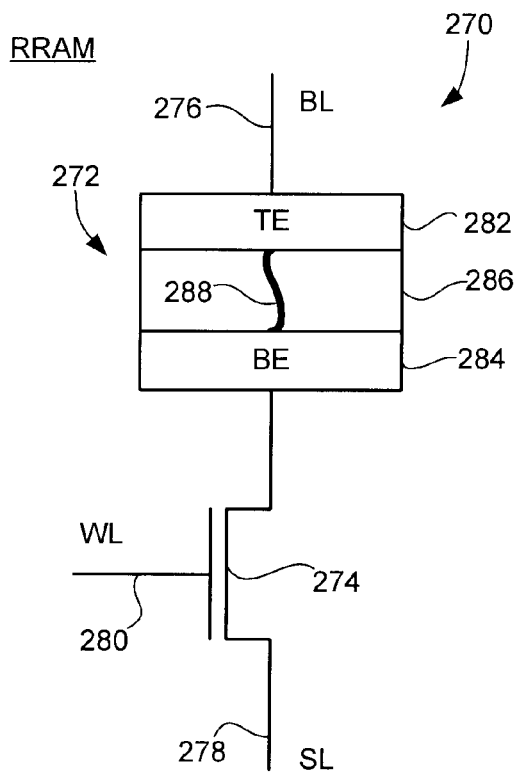
FIG. 14 illustrates a resistive random access memory (RRAM) cell that can be sanitized in accordance with the routine of FIG. 10.

FIG. 14 illustrates another memory cell 270 characterized as a 1T1R RRAM cell. As with the STRAM cell in FIG. 13, the RRAM cell includes a resistive memory element 272 and a switching device 274, characterized as an nMOS transistor. The RRAM cell 270 is accessed by respective bit, word and source lines (BL, WL and SL) 276, 278 and 280.

The resistive memory element 272 includes top and bottom conductive electrodes (TE and BE) 282 and 284. These electrode layers are separated by an intervening oxide layer 286. Application of appropriate programming currents induces migration of conductive ions into the oxide layer 286 to form a conductive filament 288 that partially or completely spans the oxide layer and reduces the overall resistance of the cell. The filaments 288 can be subsequently removed by appropriate programming currents that urge migration of the ions back to the respective electrode layers.

As before, the remnants of ion migration and residual filament formation may be discoverable through laboratory analysis, enabling prior stored states to be discovered. It is contemplated that the various techniques of FIG. 10 can be readily adapted for use in RRAM cells such as FIG. 14 to mask such prior states.

While the secure erasure operations of the present disclosure have been discussed in terms of particular locations of memory that may store sensitive user data, it will be appreciated that the same sanitizing techniques can also be applied to other regions of the memory that store metadata or other control data that may be related to the user data files for which secure erasure has been requested.

The various secure erasure techniques disclosed herein may provide a number of benefits, including reduced power consumption, reduced wear, shorter time implementation and greater levels of signature wiping over conventional approaches. The secure erasure operations disclosed herein can be adapted to a wide variety of memories and applications, and are not limited to any particular style or type of memory.

For purposes herein, the references to rows and columns will be read broadly as relational identifiers in an ordered array of elements along different axes without constituting a specific physical layout. Thus for example, the term "row" may constitute a physical column without deterring from the spirit of the present invention. Reference to a "page" will be understood broadly as an addressable block to which a multi-bit set of data can be written, and may or may not constitute a full "row" or "column" of memory cells. The term "random" will be broadly read to include "pseudo-random."

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A method for sanitizing a memory comprising sequential steps of reading a bit value associated with a selected host level address and stored in a selected memory cell of the memory at a selected physical address, inverting the bit value, writing the inverted bit value back to the selected memory cell, erasing the selected memory cell after the reading step and prior to the writing step, and subsequently erasing the selected memory cell after the writing step to place the cell in a securely erased state, wherein the reading, inverting, writing and erasing steps are repeated a plural number of times prior to the subsequently erasing step.

2. The method of claim 1, wherein the selected host level address is a logical block address (LBA), and the method further comprises subsequently writing a second bit value to the selected memory cell in the securely erased state, the second bit value associated with a different, second LBA.

3. The method of claim 1, further comprising prior steps of generating a random bit value and writing the random bit value to the selected memory cell, wherein the bit value obtained during the reading step constitutes said random bit value from the generating step.

4. The method of claim 1, in which the selected memory cell is characterized as a multi-level cell (MLC) that stores n bits using $2^n$ states, and the inverting step comprises using a cyclical conversion table that respectively associates each of the $2^n$ states with a remaining one of the other $2^n$ states to carry out said bit inversion.

5. The method of claim 1, in which the reading step comprises reading a multi-bit sequence from a plurality of adjacent memory cells in the memory comprising at least one logical 0 and one logical 1, the inverting step comprises inverting the multi-bit sequence, and the writing step comprises writing the inverted multi-bit sequence back to the plurality of adjacent memory cells so that each memory cell of said plurality stores a different logical value at the conclusion of the writing step as compared to a logical value stored by each said memory cell prior to the reading step.

6. The method of claim 1, in which the memory is characterized as a flash memory array and the selected memory cell is a flash memory cell.

7. A method for performing a memory sanitizing operation comprising sequential steps of:
reading a multi-bit sequence stored in selected flash memory cells of a flash memory;
temporarily storing the multi-bit sequence in a buffer memory;
erasing the selected flash memory cells after the multi-bit sequence is stored in the buffer memory;
storing a bit-inverted representation of the multi-bit sequence in the selected flash memory cells after the selected flash memory cells are erased; and
subsequently erasing the selected flash memory cells storing the bit-inverted representation of the multi-bit sequence to place the selected flash memory cells in a securely erased state, wherein the reading, temporarily storing, erasing and overwriting steps are successively repeated at least three times during said memory sanitizing operation.

8. The method of claim 7, in which the multi-bit sequence of the reading step comprises at least one logical 0 and at least one logical 1, and the bit-inverted representation of said multi-bit sequence is obtained by replacing each logical 0 in the multi-bit sequence of the reading step with a logical 1 and by replacing each logical 1 in the multi-bit sequence of the reading step with a logical 0.

9. The method of claim 7, in which the multi-bit sequence of the reading step comprises a first multi-bit random value generated by a random number generator, and the bit-inverted representation of said multi-bit sequence is obtained by using the random number generator to generate a second multi-bit random value and forcing a selected bit at a selected bit location in the second multi-bit random value to an inverted bit value of a corresponding bit at the selected bit location in the first multi-bit random value.

10. The method of claim 7, in which the overwriting step uses a predetermined run-length limited constraint to force a bit inversion of at least a selected bit in the bit-inverted representation of the multi-bit sequence.

11. An apparatus comprising:
a memory comprising a plurality of memory cells; and
a controller adapted to execute a memory sanitizing operation by sequentially directing a read operation upon at least one selected memory cell of the memory to retrieve a bit value stored therein, a bit-inversion operation upon the retrieved bit value to generate an inverted bit value, a write operation to write the inverted bit value back to the at least one selected memory cell, an erasure operation upon the memory cell after the read operation and prior to the write operation, a second erasure operation after the write operation to remove the inverted bit value from the at least one selected memory cell, and a second write operation to write a second bit value to the at least one selected memory cell, the bit value associated with user data, the second bit value comprising a random number.

12. The apparatus of claim 11, wherein the user data is associated with a selected logical block address (LBA), and the second bit value is a randomly generated bit.

13. The apparatus of claim 11, further comprising a bit inverter block which inverts the bit value to generate the inverted bit value and which temporarily stores said inverted bit value in a memory location.

14. The apparatus of claim 13, further comprising a history comparison circuit which temporarily stores in memory a succession of bit values each stored in the at least one memory cell in turn, and which directs the bit inverter block to generate the inverted bit value responsive to said succession of bit values comprising n immediately successive instances of the same logical bit value where n is a plural number.

15. A method for sanitizing a memory comprising sequential steps of reading a bit value stored in a selected memory cell of the memory, inverting the bit value, and writing the inverted bit value back to the selected memory cell by storing a non-standard amount of total accumulated charge in the memory cell, the non-standard amount of total accumulated charge stored in the memory cell by transferring a first plural number of charge increments to the memory cell to provide a standard amount of total accumulated charge on the memory cell, performing a read verification operation to verify the first plural number of charge increments successfully programmed the cell to the inverted bit value, and then transferring at least one additional charge increment to the memory cell after the read verification operation to increase the total accumulated charge stored in the memory cell from the standard amount of total accumulated charge to the non-standard amount of total accumulated charge.

16. The method of claim 15, in which the non-standard amount of total accumulated charge is stored on a floating gate of the memory cell in relation to a random number.

17. The method of claim 15, further comprising writing a second bit value to the selected memory cell after the erasing step, and repeating the reading, inverting and writing steps.

18. The method of claim 15, in which the non-standard amount of total accumulated charge is stored in the memory cell by steps comprising generating a random number, and applying a total number of charge increments to a floating gate structure of the memory cell to program the memory cell to a final programming state, the total number of charge increments equal to the generated random number.

19. The method of claim 15, in which the at least one additional charge increment comprises a plural number of additional charge increments, the method further comprising generating a random number and setting the plural number of additional charge increments equal to the generated random number.

* * * * *